(12) United States Patent  (10) Patent No.: US 8,552,283 B2
Dede et al.  (45) Date of Patent: Oct. 8, 2013

(54) THERMOELECTRIC APPLICATION FOR WASTE HEAT RECOVERY FROM SEMICONDUCTOR DEVICES IN POWER ELECTRONICS SYSTEMS

(75) Inventors: Ercan Mehmet Dede, Ann Arbor, MI (US); Brian Joseph Robert, St. Clair Shores, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 780 days.

(21) Appl. No.: 12/685,380

(22) Filed: Jan. 11, 2010

(65) Prior Publication Data

US 2011/0168223 A1  Jul. 14, 2011

(51) Int. Cl.
  *H01L 35/30* (2006.01)
  *H01L 35/34* (2006.01)
  *H01L 35/28* (2006.01)
  *H01L 35/02* (2006.01)
  *H01L 23/34* (2006.01)
  *H01L 23/38* (2006.01)
  *H01L 23/427* (2006.01)

(52) U.S. Cl.
  USPC ........... 136/205; 136/201; 136/204; 136/242; 257/712; 180/54.1; 62/3.7

(58) Field of Classification Search
  USPC .......................................................... 136/205
  See application file for complete search history.

(56) References Cited

U.S. PATENT DOCUMENTS

| 6,143,975 | A * | 11/2000 | Liao et al. | 136/201 |
| 2003/0094265 | A1 * | 5/2003 | Chu et al. | 165/133 |
| 2005/0121065 | A1 | 6/2005 | Otey | |
| 2005/0204733 | A1 | 9/2005 | Sasaki | |
| 2007/0056622 | A1 * | 3/2007 | Leng et al. | 136/205 |
| 2008/0245590 | A1 | 10/2008 | Yonak et al. | |
| 2009/0277489 | A1 | 11/2009 | Dannoux et al. | |
| 2009/0317680 | A1 | 12/2009 | Imamura et al. | |
| 2010/0295172 | A1 * | 11/2010 | Gao et al. | 257/712 |

FOREIGN PATENT DOCUMENTS

WO  WO 0027177 A1 *  5/2000

OTHER PUBLICATIONS

Tanaka Mitsuhiro, JP2008061374 (A), English machine translation, Mar. 2008, Japan, pp. 1-26.*
Encyclopædia Britannica Online Academic Edition: Encyclopædia Britannica Inc., 'integrated circuit' [online], [retrieved on Nov. 16, 2012]. Retrieved from the Internet:<URL: http://www.britannica.com/EBchecked/topic/289645/integrated-circuit-IC/>, pp. 1-10.*
Hatzikraniotis et al., Study of Thermoelectric Power Generators and Application in a Small Sized Car, European Conference on Thermoelectrics, p. 2-18-1-p. 2-18-4, 2008.
L. E. Bell et al., Cooling, Heating, Generating Power, and Recovering Waste Heat with Thermoelectric Systems, Science, vol. 321, No. 1457, 2008.
International Search Report issued Mar. 9, 2011 in Application No. PCT/US2011/020802.

* cited by examiner

*Primary Examiner* — Jeffrey T Barton
*Assistant Examiner* — Tae-Sik Kang
(74) *Attorney, Agent, or Firm* — Oblon, Spivak, McClelland, Maier & Neustadt, L.L.P.

(57) ABSTRACT

In a power electronics system of a next generation vehicle, a power module is provided including a thermoelectric device which is provided in a thermally conductive path between a power device and a cooling plate such that the thermoelectric device creates useful electric power from the waste heat of the power device.

6 Claims, 5 Drawing Sheets

THERMOELECTRIC APPLICATION FOR WASTE HEAT RECOVERY FROM SEMICONDUCTOR DEVICES IN POWER ELECTRONICS SYSTEMS

BACKGROUND OF THE INVENTION

1. Field of the Invention

Exemplary aspects of the present invention relate to the use of a thermoelectric device to recover waste heat from a semiconductor device in a power electronic system of a hybrid electric vehicle.

2. Discussion of the Background

It is widely known that land vehicles, including automobiles, have a large influence on the global environment. One such environmental impact concerns the production and transport of fuel required for vehicles. A second environmental impact is the resultant emissions that are a byproduct of the combustion of the fuel utilized by vehicles for propulsion.

Next generation vehicles, including hybrid electric vehicles, are one of several ways of addressing the need to reduce the expenditure of non-renewable fuels. Hybrid Electric Vehicles increase the overall (sometimes called well-to-wheel) efficiency of the vehicle by supplementing the power requirements of the combustion engine with an electric machine. Accordingly, hybrid electric vehicles exhibit twin environmental benefits of using less fuel and emitting fewer pollutants. Though typically more fuel efficient than conventional combustion vehicles, hybrid electric vehicles are also optimized to achieve higher levels of efficiency.

The propulsion drive of a Hybrid Electric Vehicles typically consists of a combustion engine and one or more electric drive components. These electric drives or electric machines are arranged in either series or parallel with the combustion engine.

In a series arrangement, the electric machine(s) typically provide all of the motive force for the vehicle and the combustion engine typically provides a means for providing electric energy for the electric machine(s). A single electric machine may be used in conjunction with a power splitting device, such as a differential, to provide the motive force to the vehicle wheels. Alternatively, multiple electric machines may be coupled through gear reductions and shafts to the wheels, or so-called wheel-motors may be integrated into the wheel hubs.

A fuel cell engine may be substituted for the combustion engine in a series hybrid electric vehicle arrangement. Other means of producing electric energy such as gas turbines, hydraulic motors, or the like may also be substituted.

Conversely, in a parallel Hybrid Electric Vehicle arrangement the combustion engine and the electric machine(s) each provide motive force for the vehicle. That is, torque from the engine is combined with torque from the electric machine(s) to propel the vehicle. A single electric machine is typically provided along the output shaft of the engine prior to the input shaft of the transmission. Alternatively, wheel motors may provide torque to axle shafts that are propelled by the combustion engine.

Hybrid Electric Vehicles may also combine series and parallel architectures. Such a system combines the electric machines and the combustion engine such that an electric machine may provide motive force alone or in parallel with the combustion engine. Furthermore, in the series/parallel Hybrid Electric Vehicle system another electric machine may simultaneously generate electricity or also provide motive force. This architecture sometimes called a power-split hybrid electric drive, can seamlessly change between engine-only, electric-only, or engine and electric propulsion.

Regardless of the particular architecture, the electric machines of a Hybrid Electric Vehicle are typically operated by alternating current (AC). The electric machines may be of the synchronous or asynchronous variety. One example of a synchronous AC machine is a permanent magnet machine which utilizes permanent magnets in the rotor to induce an electric field. A typical asynchronous electric machine in a hybrid electric machine may be an AC induction machine that utilizes an AC current to induce the magnetic field in the rotor.

Hybrid Electric Vehicles often utilizes an electrical energy storage device such as a battery, ultra-capacitor or the like. These energy storage devices store energy for usage by the electric machines. The ability to store electric energy and later use this energy to provide motive force, is one reason a Hybrid Electric Vehicle is more energy efficient than a conventional vehicle. The energy storage device typically transfers the stored electric energy to electric machines via direct current.

The electric machines of a Hybrid Electric Vehicle are typically operated via 3-phase alternating current which energize poles of the stator causing the rotor to rotate. This 3-phase alternating current is typically provided by a power inverter which inverts the DC energy from the energy storage device into 3-phase AC for use by the electric machines.

Power inverters may include several power modules which include several power devices. These power devices are switches which change the single phase direct current into 3-phase alternating current. The power devices may be one of an Insulated Gate Bipolar Transistor (IGBT), Metal Oxide Semiconductor Field-Effect Transistor (MOSFET), Schottky diode, etc.

Power devices produce heat while operating that must be dissipated to maintain performance. Typically the excess heat is managed in order to maintain operation of the power device. Excess heat can cause premature failure of the power device or may cause the power device to operate inefficiently.

Power electronic systems are typically cooled by heat sinks, water jackets, so-called cold plates and the like. Typically the power electronic systems dissipate heat via one of these devices to a fluid which carries the heat away from the power electronic device. These fluids may be gaseous (air for example) or liquid (water for example).

As with many technologies, the trend in power electronics systems is to create higher power density devices with a smaller size. However, the increase in power density of the power electronic system also necessitates improvements in heat dissipation.

Furthermore, increasing the thermodynamic efficiency is a common goal of many devices. One known means of increasing the thermodynamic efficiency of a system is through the use of thermoelectric devices.

One application of a thermoelectric device is to provide electric power based on a temperature differential. When opposite junctions of a thermoelectric device are respectively heated and cooled, a voltage potential is created by the temperature differential. This "Seebeck" voltage can then be used as a power source.

Land vehicles have utilized thermoelectric devices to make use of the Seebeck effect for the direct conversion of waste heat of a combustion engine into electricity. In particular, thermoelectric devices have been arranged in between an exhaust pipe and a heat sink in order to produce electricity.

SUMMARY OF THE INVENTION

In an exemplary embodiment, a power module of a power electronics system of a hybrid electric vehicle includes a power device that switches electric power, a thermoelectric device that produces a harvested electric power, and a plate that dissipates heat produced by the power device.

The thermoelectric device is provided in a first thermal path between the power device and the plate, such that a temperature differential across the thermoelectric device is formed between a respective top and bottom portions of the thermoelectric device.

Furthermore, the harvested electric power is produced by the thermoelectric device based on the temperature differential.

The foregoing paragraphs have been provided by way of general introduction and are not intended to limit the scope of the following claims. The presently preferred embodiments, together with further advantages, will be best understood by reference to the following detailed description taken in conjunction with the accompanying drawings.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
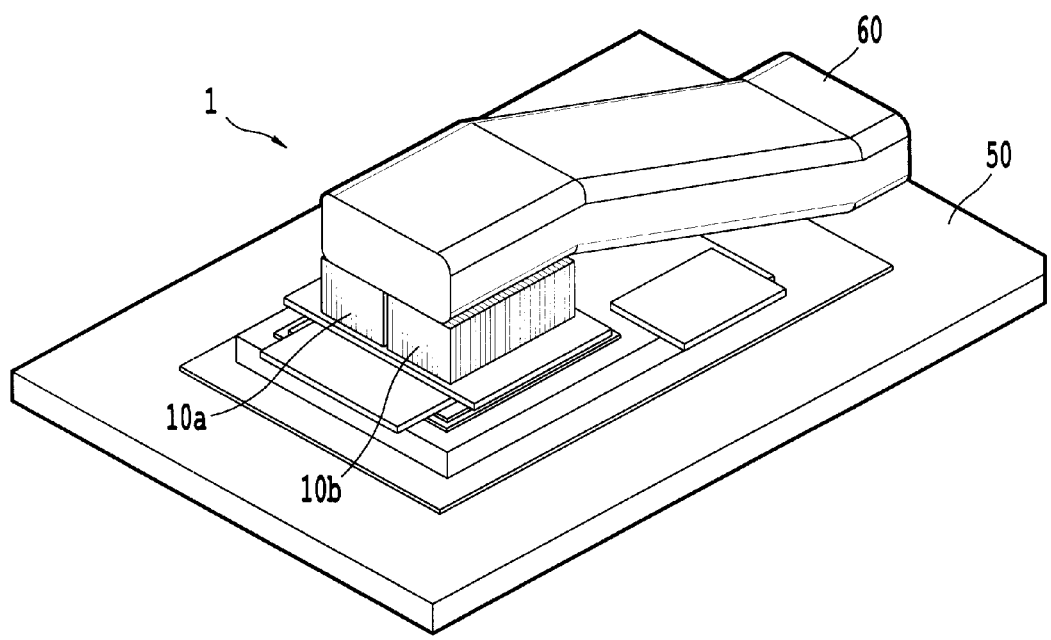
FIG. 1 is perspective view illustrating a first embodiment of the power electronics module including a thermoelectric device.

Referring now to the drawings, wherein like reference numerals designate identical or corresponding parts throughout the several views.

First Exemplary Embodiment

Figure 2:
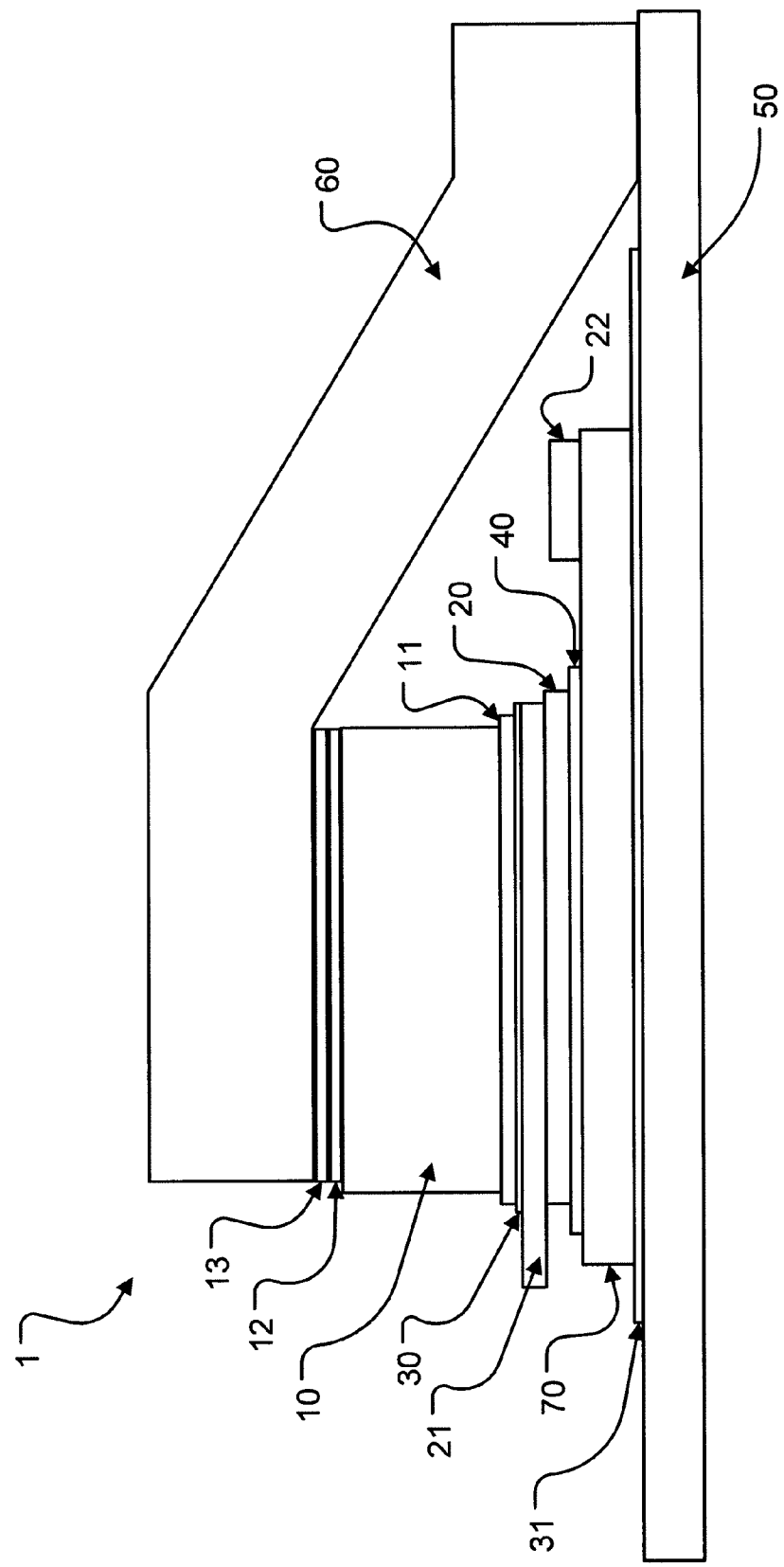
FIG. 2 is a schematic view of the first embodiment illustrating the power electronics module and the thermoelectric device.

FIG. 1 depicts a perspective view of a first exemplary embodiment of a power module 1 that includes power device 20. FIG. 2 schematically illustrates the first exemplary embodiment of the power module as seen from a front side view. The power device 20, schematically depicted as a transistor, is a MOSFET but may be substituted with a similar device such as an IGBT. The power device 20 is mounted on a substrate 70 via a bonding layer 40. The bonding layer 40 may be a solder layer, including for example, Tin Lead (SnPb), Gold Tin (AuSn), or Gold Germanium (AuGe). The bonding layer may also be a sintered layer, including for example nano-Silver (Ag).

Also attached to the substrate 70 is the power device bottom side terminal 22. The power device bottom side terminal 22 may consist of Aluminum (Al), Copper (Cu), or alloys thereof. The power device bottom side terminal 22 communicates with a first electrical bus, not shown. The power device bottom side terminal 22 also communicates with the power device 20 via circuitry of the substrate, not shown, and the bonding layer 40. Accordingly, it is advantageous for the power device bottom side terminal 22 and the bonding layer 40 to each be capable of conducting electricity.

A portion of the top side of the power device 20 contacts the power device top side terminal 21. Similar to the power device bottom side terminal 22, the power device top side terminal 21 may consist of Aluminum (Al), Copper (Cu), or alloys thereof. The power device top side terminal 21 communicates with a second electrical bus, not shown. The power device top side terminal 21 may communicate directly with the power device 20 or may communicate via a conductive layer.

One of the power device top side terminal 21 and the power device bottom side terminal 22 is an electrical input for the power device 20. The other of the power device top side terminal 21 and the power device bottom side terminal 22, is an output of the power device 20. Based on a control process, the power device 20 switches a conductive path between the power device top side terminal 21 and the power device bottom side terminal 22.

A bottom portion of the substrate 70 contacts an insulation layer 31. The insulation layer 31 includes an electrically insulating material. The insulation layer 31 advantageously is a dielectric layer. Furthermore, the insulation layer 31 advantageously has a high thermal conductivity. Accordingly, the insulation layer 31 is an electric insulator and a thermal conductor. Typical materials for the insulation layer 31 may be Epoxy Resin, Alumina Cement ($Al_2O_3$), Aluminum Nitride (AlN), Aluminum Silicon Carbide (AlSiC), or similar.

Below the insulation layer 31, in a direction opposite of the power device 20, is a base plate 50 which communicates with the insulation layer 31. The base plate 50 is advantageously a thermally conductive material such that heat may be dissipated away from the power device 50. The base plate 50 may be made of Aluminum, Copper, or an alloy such as Aluminum Silicon Carbide.

The base plate 50 also advantageously exhibits low coefficient of thermal expansion. In particular, a base plate 50 including Aluminum Silicon Carbide exhibits properties of both high thermal conductivity and low coefficient of thermal expansion. The ceramic Silicon Carbide particles have a low coefficient of thermal expansion. Whereas, the Aluminum matrix which supports the Silicon Carbide has high thermal conductivity.

An insulation layer 30 contacts a top portion of the power device top side terminal 21. The insulation layer 30, like the insulation layer 31, is advantageously electrically insulating and thermally conductive. The insulation layer 30 may also be made of Epoxy Resin, Alumina Cement ($Al_2O_3$), Aluminum Nitride (AlN), Aluminum Silicon Carbibe (AlSiC), or the like. The insulation layer 30 covers the power device top side terminal 21 and prevents an electric current from flowing in an unintended electrical path, i.e. a path other than the second electrical bus, not pictured.

The insulation layer 30 is provided between the power device 20 and a thermoelectric device terminal 11. The thermoelectric device terminal 11 advantageously includes a thermally conductive material such as Copper or Aluminum. The thermoelectric device terminal 11 is also advantageously electrically conductive.

A thermoelectric device 10 is provided to contact the thermoelectric terminal 11. The thermoelectric device 10 is a device that produces electrical power when opposite sides of the device have a thermal differential. As can be seen in FIG. 1, the thermoelectric device 10 includes a positive (+) junction 10a and a negative (−) junction 10b. Further, the thermoelectric device 10 is advantageously a Bismuth Antimony Telluride (BiSbTe) device. However, similar thermoelectric device materials may also used.

A bottom portion the thermoelectric device 10 is in communication with the thermoelectric terminal 11. Moreover, the thermoelectric device 10 is in electric and thermal communication with the thermoelectric terminal 11. Furthermore, the thermoelectric device 10 is in thermal communication with the power device 20. Specifically, a bottom portion of thermoelectric device 10 is in thermal communication with the power device 20 via the power device top side terminal 21, the insulation layer 30, and the power device terminal 11. Accordingly, the bottom portion of the thermoelectric device 10 is warmed by heat produced by the power device 20.

A top portion of the thermoelectric device 10 is in communication with electrically and thermally conductive layer 12. The conductive layer 12 electrically connects positive junction 10a and negative junction 10b of the thermoelectric device 10. Accordingly a current path is formed between positive junction 10a and negative junction 10b.

A thermally conductive and electrically isolating insulation layer 13 is provided between the conductive layer 12 and heat pipe 60. The insulation layer 13 electrically isolates the conductive layer 12 from the heat pipe 60 and conducts heat from the conductive layer 12 to the heat pipe 60.

The heat pipe 60 is made of a thermally conductive material such as Copper or Aluminum. As can be seen in FIG. 2, the heat pipe 60 is also in communication with the base plate 50. Accordingly, there is a thermally conductive path between the thermal electric device 10 and the base plate 50, via conductive layer 12, insulation layer 13, and heat pipe 60.

The first exemplary embodiment includes a thermally conductive path in which the thermoelectric device 10 is connected in series between the power device 20 and the base plate 50. The base plate 50 in this exemplary embodiment is designed to dissipate heat produced by the power device 20. Due to this communication with the base plate 50, via the heat pipe 60, a top portion of the thermoelectric device 10 is comparatively cooler that the bottom portion of the thermoelectric device 10.

As described above, the top portion of the thermoelectric device 10 is in thermal communication with the base plate 50 and the bottom portion of the thermoelectric device 10 in thermal communication with the power device 20. Further, the power device 20 produces heat while in operation. Accordingly, a temperature differential is formed across the thermoelectric device 10 when the power device 20 is in operation.

This temperature differential in the thermoelectric device 10 causes the thermoelectric device 10 to produce a voltage potential due to the Seebeck effect. This voltage potential is present at the thermoelectric device terminal 11. When this voltage potential is attached to a load, then electric power is produced as a result of the temperature differential across the thermoelectric device 10.

Therefore, as described above, electric power may be produced by the thermoelectric device placed in thermal series between the power device 20 and the base plate 50. This "harvested" electric power is produced from the waste heat produced by the power device 20. Accordingly, the thermoelectric device 10 increases the thermodynamic efficiency of the power module 1.

The thermoelectric device 10 of the first embodiment is assumed to have a conversion efficiency of 10 percent. If a temperature differential of approximately 60 degrees Celsius is attained across the thermoelectric device 10, a single thermoelectric device 10 may produce 0.25 W Accordingly, a power module 1 including twenty-two thermoelectric devices 10 as described in the first exemplary embodiment, may produce 5.5 W of harvested power.

Second Exemplary Embodiment

Figure 3:
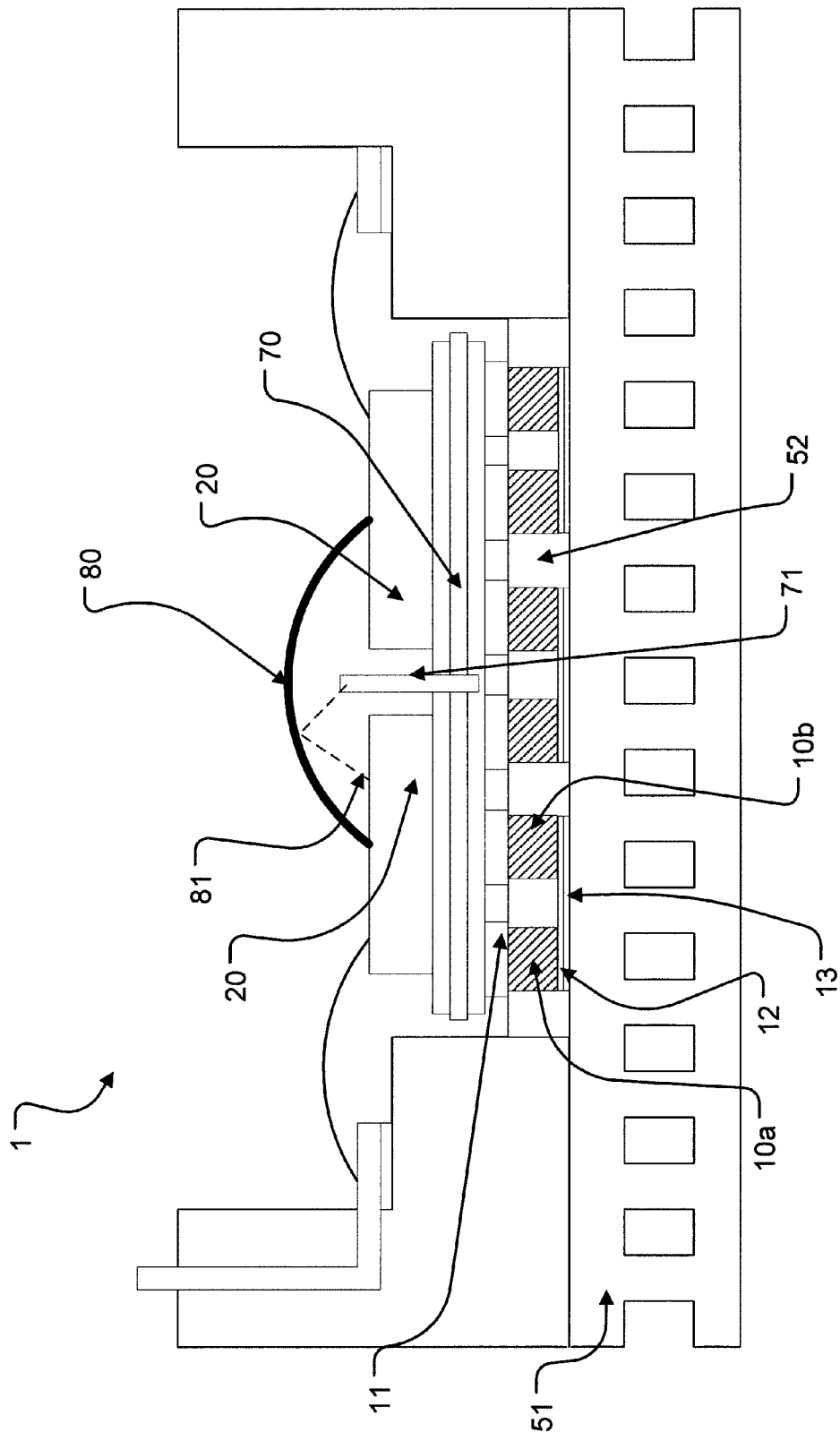
FIG. 3 is schematic view illustrating a second embodiment of a power electronics module including a thermoelectric device. The power electronic module is shown utilizing wire (or ribbon) bonds.

FIG. 3 illustrates a second exemplary embodiment of a power module 1. The power module 1 includes a power device 20 which is schematically shown as a transistor (MOSFET, IGBT, etc.) and diode pair.

The a bottom portion of the power device 20 is in communication with a substrate 70. The substrate 70 is a stacked structure which includes an electrical insulating layer between electrically conductive layers. The substrate 70 advantageously is a direct bonded aluminum (DBA) substrate. The substrate 70 may include a circuit pattern formed in the bottom layer. The substrate 70 could also be made of direct bonded copper (DBC) or the like. The substrate 70 is furthermore thermally conductive.

A top portion of the power device 20 is in communication with wire 80. The wire 80 can be a single wire or plurality of wires. The wire 80 may also be an electrically conductive ribbon or tape. The wire 80 is bonded to the top portion of the power device 20. The bond may be a solder bond [i.e. Tin Lead (SnPb), Gold Tin (AuSn), or Gold Germanium (AuGe)] or a sintered bond [nano-Silver (Ag)].

The substrate 70 is in communication with an electric lead 71. The electric lead 71 is also electrically connected with the wire 80 via an electric connection 81. Therefore the substrate 70 in electric communication with the wire 80, via electric lead 71, and electric connection 81.

The substrate 70 is also in communication with cooling jacket 51. The cooling jacket 51 allows a fluid to flow within an internal structure. The fluid may advantageously be water or a liquid coolant such as glycol mixed with water. The fluid flowing within the cooling jacket dissipates heat produced by the power device 20.

Between the substrate 70 and the cooling jacket 51 there is a thermal interface 52. The thermal interface 52 transfers heat from the substrate 70 to the cooling jacket 51. Embedded within the thermal interface 52 are a plurality of thermoelectric devices 10. The thermoelectric devices 10 include a positive (+) junction 10a and a negative (−) junction 10b. The thermoelectric devices 10 are advantageously made of Bismuth Antimony Telluride (BiSbTe).

A bottom portion of the thermoelectric device 10 is in communication with electrically and thermally conductive layer 12. In particular, the conductive layer 12 electrically connects positive junction 10a and negative junction 10b of the thermoelectric device 10. Accordingly a current path is formed between positive junction 10a and negative junction 10b.

A thermally conductive and electrically isolating insulation layer 13 is provided between the conductive layer 12 and cooling jacket 51. The insulation layer 13 electrically isolates the conductive layer 12 from the cooling jacket 51 and conducts heat from the conductive layer 12 to the cooling jacket 51.

The thermoelectric devices 10 are also in communication with the substrate 70 via a thermoelectric device terminal 11. Furthermore, the thermoelectric devices 10 are in communication with the wire 80 via the thermoelectric device terminal 11, the substrate 70, the electric lead 71, and the electric connection 81. This electric path facilitates energy recovery from the thermoelectric devices 10.

Accordingly, the thermoelectric devices 10 which are embedded in the thermal interface 52 are part of a thermal path between the power device 10 and the cooling jacket 51 via the substrate 70, the thermoelectric terminal 11, the thermoelectric device 10, the conductive layer 12, and the insulation layer 13. As such, a top side of a representative thermoelectric device 10, which is in communication with the power device 20 is respectively warmer than a bottom side of the thermoelectric device 10 which is communication with the cooling jacket 51. Therefore, a temperature differential is formed across the thermoelectric device 10 when heat is produced by the operation of the power device 10.

In accordance with the Seebeck effect, this temperature differential causes the thermoelectric device 10 to create a voltage potential. The voltage potential is present at the thermoelectric device terminal 11. Accordingly, electric power produced due to the temperature differential is transferred from the thermoelectric device 10 to the substrate 70 via the thermoelectric device terminal 11.

Third Exemplary Embodiment

Figure 4:
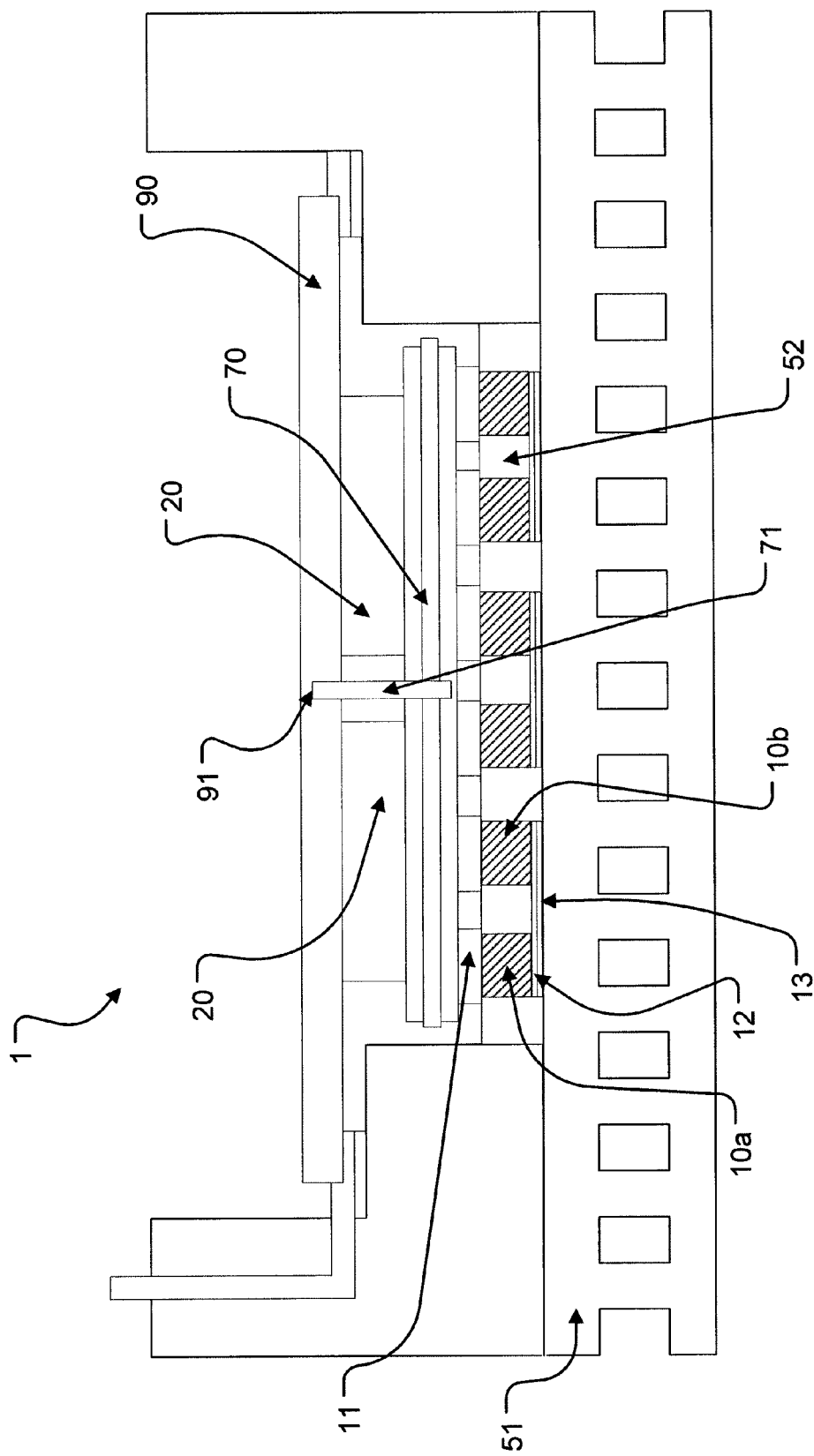
FIG. 4 is a schematic view illustrating a third embodiment of the power electronics module including a thermoelectric device. The power electronics module is shown utilizing a lead frame.

FIG. 4 illustrates a third exemplary embodiment of a power module 1. The power module 1 includes a power device 20 which is schematically shown as a transistor (MOSFET, IGBT, etc.) and diode pair.

The power module of the third exemplary embodiment includes the cooling jacket 51, substrate 70, the thermoelectric device terminal 11, the conductive layer 12, the insulation layer 13, and the thermal interface 52 as discussed above with regard to the second exemplary embodiment. Furthermore, similar to the second embodiment, a plurality of thermoelectric devices 10 are embedded within the thermal interface 52.

As shown in FIG. 4, the third exemplary embodiment includes a lead frame 91 which communicates with the top portion of the power device 20. Furthermore, the lead frame 91 communicates with the electric lead 71. Accordingly, an electric path between the lead frame and the thermoelectric device is formed via the thermoelectric device terminal 11, the substrate 70, and the electric lead 71.

Similar to the second exemplary embodiment, the thermoelectric devices 10 embedded in the thermal interface 52 are part of a thermal path between the power device 10 and the cooling jacket 51. When the power device 20 operates, heat is produced. Accordingly, a top side of a representative thermoelectric device 10, which is in communication with the power device 20 is respectively warmer than a bottom side of the thermoelectric device 10 which is communication with the cooling jacket 51. Therefore, a temperature differential is formed across the thermoelectric device 10 which produces a voltage potential at the thermoelectric device terminal 11.

Exemplary Uses of the Harvested Electric Power

As described in the above embodiments, a thermoelectric device placed in thermal series between a power device and cooling medium produces electric power. This electric power harvested by the thermoelectric device 10 has several advantageous uses within a hybrid electric vehicle.

Figure 5:
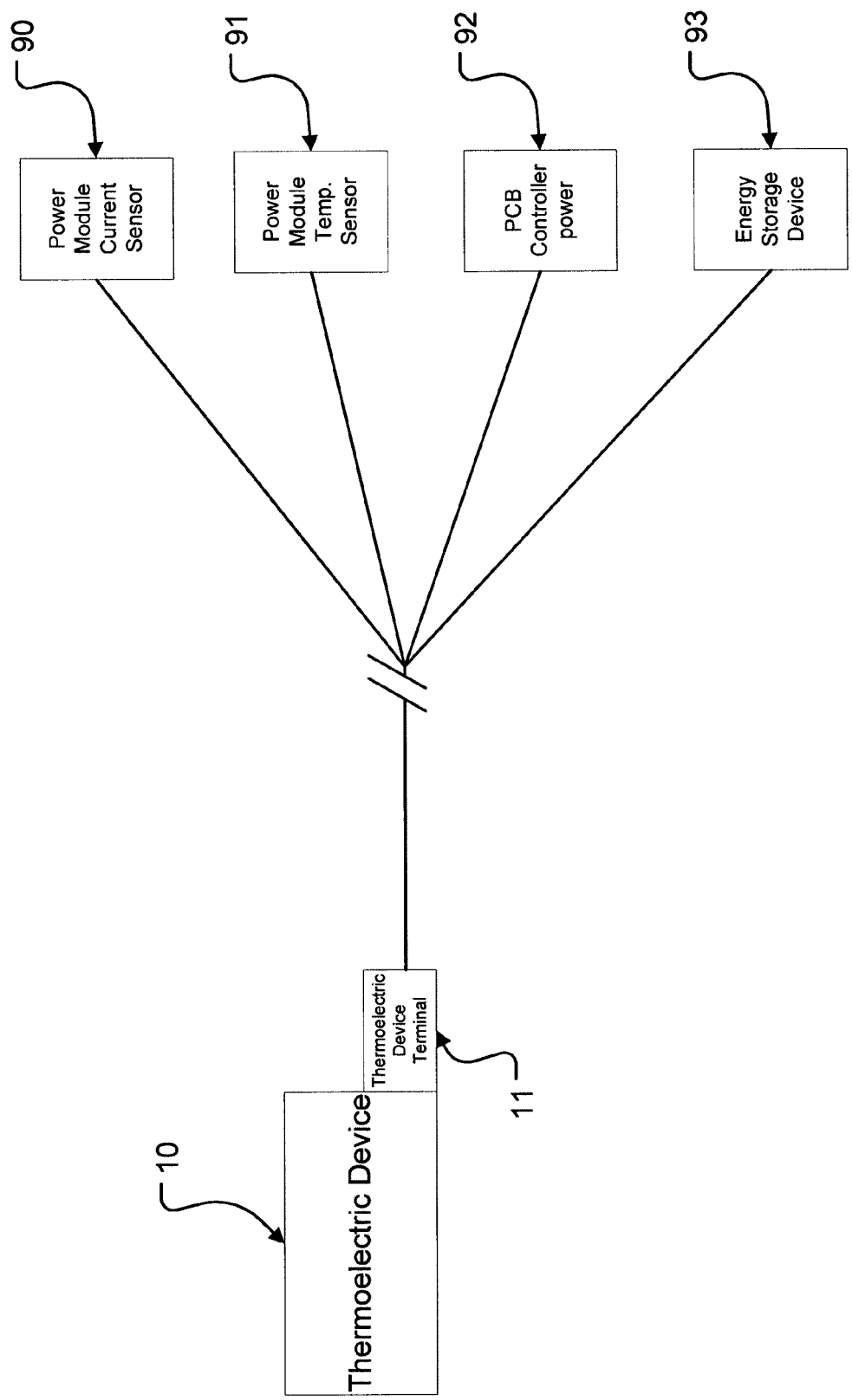
FIG. 5 is a schematic view illustrating uses for the harvested electric power from the thermoelectric device of the preferred embodiments.

FIG. 5 illustrates some of these potential uses. For example, the power produced by the thermoelectric device 10 may be used to energize power module sensors such as a current sensor 90 or temperature sensor 91 which are used in the control of the power module 1. The harvested electric power could also be used to operate a printed circuit board (PCB) controller 92 which controls the power module 1. The power produced by the thermoelectric device 10 may also be input into an energy storage device 93 for later use by the power module 1. The energy storage device 93 may advantageously be a battery, capacitor, or the like.

Furthermore, as described above with respect to the preferred embodiments, thermoelectric devices may increase the thermodynamic efficiency of a power module of a hybrid electric vehicle. Accordingly, less fuel in consumed by the vehicle which has environmental and economical benefits.

Obviously, numerous modifications and variations of the present invention are possible in light of the above teachings. It is therefore to be understood that within the scope of the appended claims, the invention may be practiced otherwise than as specifically described herein.

The invention claimed is:

1. A power module of a power electronics system of a hybrid electric vehicle comprising:
   a substrate; a power device that switches electric power on the substrate;
   a thermoelectric device that produces a harvested electric power, the thermoelectric device including a top portion and a bottom portion;
   a metal base plate that dissipates heat produced by the power device; and
   a heat pipe that communicates with the top portion of the thermoelectric device and that communicates with the metal base plate,
   wherein the power module includes a first thermal path between the power device and the metal base plate via the thermoelectric device and the heat pipe such that a temperature differential across the thermoelectric device is formed between the top and bottom portions of the thermoelectric device,
   wherein the power module includes a second thermal path between the power device and the metal base plate via the substrate,
   wherein the harvested electric power is produced by the thermoelectric device based on the temperature differential, and
   wherein the power device is between the substrate and the thermoelectric device.

2. The power module of claim 1, wherein the temperature differential is formed in the thermoelectric device when the power device produces heat.

3. The power module of claim 1, further comprising:
   a thermoelectric device terminal that communicates with the bottom portion of the thermoelectric device; and
   a first insulation layer disposed between the thermoelectric device terminal and a top portion of the power device, such that the first insulation layer is an electrical insulator and a thermal conductor,
   wherein the bottom portion of the thermoelectric device communicates with the top portion of the power device via the thermoelectric device terminal and the first insulation layer.

4. The power module of claim 3, further comprising:
   a power device bottom side terminal disposed on the substrate;
   a bonding layer between a bottom portion of the power device and a top portion of the substrate; and
   a second insulation layer between a bottom portion of the substrate and a top portion of the metal base plate, such that the second insulation layer is an electrical insulator and a thermal conductor,
   wherein the second thermal path is between the bottom portion of the power device and the metal base plate via the bonding layer, the substrate, and the second insulation layer.

5. The power module of claim 3, further comprising:
a top side power device terminal between the top portion of the power device and the first insulation layer,
wherein the first thermal path is a path between the top portion of the power device and the metal base plate via the top side power device terminal, the first insulation layer, the thermoelectric device terminal, the thermoelectric device, and the heat pipe.

6. The power module of claim 4, further comprising:
a top side power device terminal between the top portion of the power device and the first insulation layer,
wherein the first thermal path is a path between the top portion of the power device and the metal base plate via the top side power device terminal, the first insulation layer, the thermoelectric device terminal, the thermoelectric device, and the heat pipe.

* * * * *